United States Patent
Ku et al.

(10) Patent No.: US 10,069,407 B1
(45) Date of Patent: Sep. 4, 2018

(54) CONVERTERS TO CONVERT INPUT VOLTAGES TO OUTPUT VOLTAGES

(71) Applicant: Hewlett Packard Enterprise Development LP, Houston, TX (US)

(72) Inventors: Chung-Ping Ku, Taipei (TW); Gary Kai Hsien Wang, Taipei (TW); David Mohr, Houston, TX (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 0 days.

(21) Appl. No.: 15/447,553

(22) Filed: Mar. 2, 2017

(51) Int. Cl.
*H02M 3/04* (2006.01)
*H02M 7/04* (2006.01)
*H02M 7/00* (2006.01)
*H02M 1/42* (2007.01)
*H05K 7/20* (2006.01)

(52) U.S. Cl.
CPC ............... *H02M 3/04* (2013.01); *H02M 1/42* (2013.01); *H02M 7/003* (2013.01); *H02M 7/04* (2013.01); *H05K 7/20909* (2013.01)

(58) Field of Classification Search
CPC .... H02M 3/155–3/1588; H02M 7/003; H02M 7/23; H02M 3/1584
See application file for complete search history.

(56) References Cited

U.S. PATENT DOCUMENTS

| | | | |
|---|---|---|---|
| 5,319,536 A | 6/1994 | Malik | |
| 5,576,941 A * | 11/1996 | Nguyen | H02J 9/061 363/133 |
| 7,205,740 B1 * | 4/2007 | Wei | F04D 25/166 318/434 |
| 8,395,917 B2 | 3/2013 | Humphrey | |
| 9,622,373 B1 * | 4/2017 | Sarti | H05K 7/1492 |
| 9,793,754 B2 * | 10/2017 | Myhre | G06F 1/30 |
| 2002/0071292 A1 | 6/2002 | Aihara | |
| 2002/0188383 A1 * | 12/2002 | Elek | H02M 1/34 700/297 |
| 2006/0213890 A1 * | 9/2006 | Kooken | B23K 9/095 219/130.21 |
| 2007/0047100 A1 * | 3/2007 | Takahashi | H02J 9/061 359/689 |
| 2007/0253135 A1 * | 11/2007 | Bovitz | H02M 1/10 361/118 |
| 2008/0291879 A1 * | 11/2008 | Duff | H02J 7/0068 370/338 |
| 2009/0322257 A1 * | 12/2009 | Kim | H02J 9/005 315/308 |

(Continued)

OTHER PUBLICATIONS

Levy, A. et al., :Power Supply System Integration Part 1: Single Source Fault Tolerant Power Systems, Power Electronics, Technology Dynamics, Inc., Jun. 1, 2001, 11 pages.

(Continued)

*Primary Examiner* — Yusef A Ahmed
(74) *Attorney, Agent, or Firm* — Hewlett Packard Enterprise Patent Department

(57) ABSTRACT

An example device in accordance with an aspect of the present disclosure includes a converter to convert an input voltage to an output voltage. The converter includes an input connector that occupies greater than one third of a frontal area of the converter.

15 Claims, 6 Drawing Sheets

(56) References Cited

U.S. PATENT DOCUMENTS

| | | | |
|---|---|---|---|
| 2010/0186441 A1* | 7/2010 | Lee | F24F 1/20 62/507 |
| 2012/0249026 A1* | 10/2012 | Wei | H02P 6/16 318/400.3 |
| 2013/0099559 A1 | 4/2013 | Machi | |
| 2014/0001871 A1* | 1/2014 | Vogman | H02J 5/00 307/82 |
| 2014/0347005 A1* | 11/2014 | Zhou | H02J 7/007 320/107 |
| 2015/0146458 A1* | 5/2015 | Lim | H02M 3/158 363/44 |
| 2015/0177808 A1* | 6/2015 | Sarti | G06F 1/30 713/300 |
| 2015/0180232 A1* | 6/2015 | Mino | H02J 1/08 307/23 |
| 2015/0216077 A1* | 7/2015 | Tanaka | H02M 7/003 361/697 |
| 2015/0244294 A1* | 8/2015 | Wei | H02M 3/156 318/139 |
| 2015/0245531 A1* | 8/2015 | Meinecke | H02M 3/158 361/679.02 |
| 2015/0333616 A1* | 11/2015 | Li | H02M 1/4208 713/300 |
| 2016/0006299 A1* | 1/2016 | Myhre | G06F 1/30 307/66 |
| 2016/0043634 A1* | 2/2016 | Bemat | H02M 1/4225 713/300 |
| 2016/0241156 A1* | 8/2016 | Kawakami | H02M 7/003 |
| 2017/0150860 A1* | 6/2017 | Park | A47L 9/2842 |
| 2017/0170733 A1* | 6/2017 | Ferencz | H02M 3/33569 |

OTHER PUBLICATIONS

Polyamp, "Parallel Connection of PSU and DC/DC Converters", Polyamp AB, Jul. 4, 2012, 3 pages.

Unknown, "Industrial Power Supplies Deliver 2500w in Slim-line 1u High Format", Welcome to the TDK-Lambda Newsroom, Apr. 28, 2016, 3 pages.

* cited by examiner

CONVERTERS TO CONVERT INPUT VOLTAGES TO OUTPUT VOLTAGES

BACKGROUND

Power supply units (PSUs) provide power to computing systems, such as servers. The PSUs can be used in various server form factors, such as those associated with rack sizes and referred to by rack units (U), e.g., 1U, 2U, 4U, etc. having various widths. Such form factors can impose design constraints on various features included in PSUs.

BRIEF DESCRIPTION OF THE DRAWINGS/FIGURES

DETAILED DESCRIPTION

A PSU can accommodate a 1U form factor with, e.g., a 68 millimeter (mm) width. However, such a PSU may include a fan for cooling, which can occupy frontal area of the PSU and constrain the size of an input power inlet/coupling. For example, such a PSU may be constrained to receiving an alternating current (AC) input power of no larger than 10 amps (A), using an input connector such as the International Electrotechnical Commission (IEC) C13 AC inlet connector. The inlet connector occupies available frontal area of the PSU, and the frontal area is limited by the form factor and the cooling fan. For higher input current (e.g., more than 10 A), a connector such as the IEC C19 would be used (supporting up to 16 A MAX input current), but the design of the given 68 mm width 1U power supply cannot accommodate the frontal area/size of the IEC C19 inlet. This limits the maximum power in the 68 mm width 1U power supply, due to the form factor and need for cooling.

To address such issues, example implementations described herein may use desired form factors while providing cooling, redundancy, and increased power density. In an example implementation, a redundant power supply unit can accommodate 16 A using an IEC C19 AC inlet connector while complying with the physical dimensions of a given form factor, enabling high-power applications (e.g., 2000 W~2500 W+).

Figure 1:
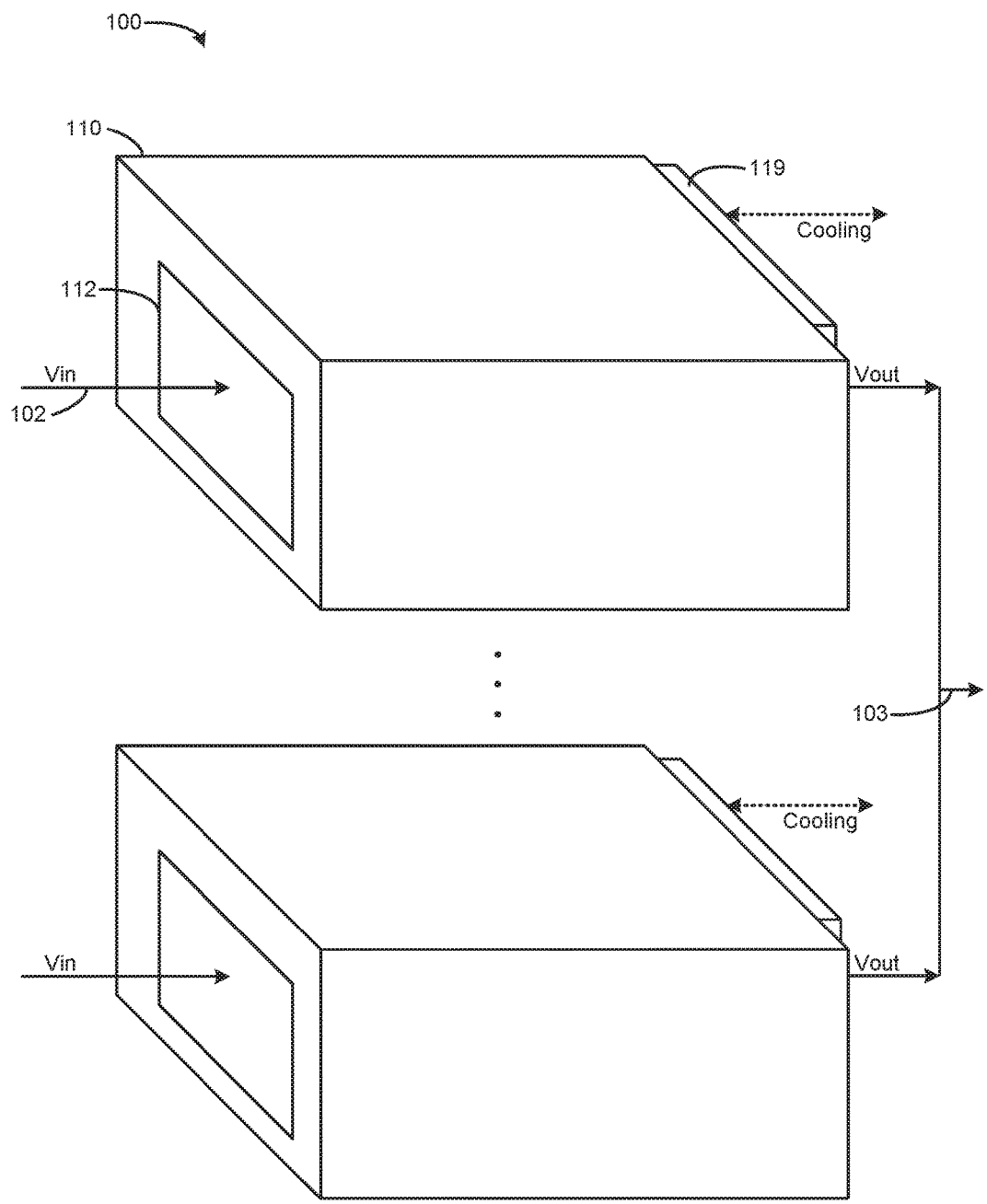
FIG. 1 is a block diagram of a power supply unit including a plurality of AC/DC converters according to an example.

FIG. 1 is a block diagram of a power supply unit (PSU) 100 including a plurality of alternating current to direct current (AC/DC) converters 110 according to an example. The AC/DC converters 110 are coupled together to redundantly convert an input voltage 102 to a DC first output voltage 103. A given AC/DC converter 110 includes an input connector 112 at its front, to receive the input voltage 102. Cooling can be provided via a rear coupling 119 of the AC/DC converters 110.

The input connector 112 occupies greater than one third of a frontal area of its AC/DC converter 110 (note, the diagram of FIG. 1 is not drawn to scale). This is due to the relatively small form factor of the PSU 100, and the relatively large size of the input connector 112. Such frontal area is available for the input connector 112 because the example AC/DC converter 110 of FIG. 1 does not include a fan at its front, and instead uses the rear coupling 119 as an interface at its rear to receive cooling for the AC/DC converter 110 (e.g., from a module to interface at a rear of the AC/DC converters 110, such as a fan module or DC converter module). The rear coupling 119 also can include electrical couplings to carry power and/or signals. In some example implementations, the cooling can be provided as airflow, which can flow in either direction (front to back, or back to front). The AC/DC converter 110 is thus fanless and modular, and can be deployed in parallel with other AC/DC converters 110 for a given computing system, e.g., for increased power rating/delivery and/or redundancy, without exceeding the physical dimensions of a given form factor, and without interfering with fan placement.

Such features enable new and flexible architectures for redundant power supply units, which can support N+1 redundancy for resilience (e.g., to ensure system availability in the event of component failure). An example implementation can provide a base unit of configuration of 1+1 redundancy, which can deliver high power output to the computing system. The illustrated example implementation provides two AC/DC converters 110, which can be coupled to a module (to receive and/or convert Vout 103, and/or to provide cooling). In alternate example implementations, the AC/DC converters 110 can be provided as high voltage DC (HVDC) to DC converters 110. The converters 110 support hot-swap, redundancy, current sharing, and DC output (e.g., an output voltage of 48 V, 12 V, or other applicable voltage). Increased power rating of the PSU 100 is beneficial for applications such as big data systems, density-optimized systems, blade server systems, and the like. An example power rating can support on the order of 2500 W or more, and can support servers operating at 48 V.

Figure 2:
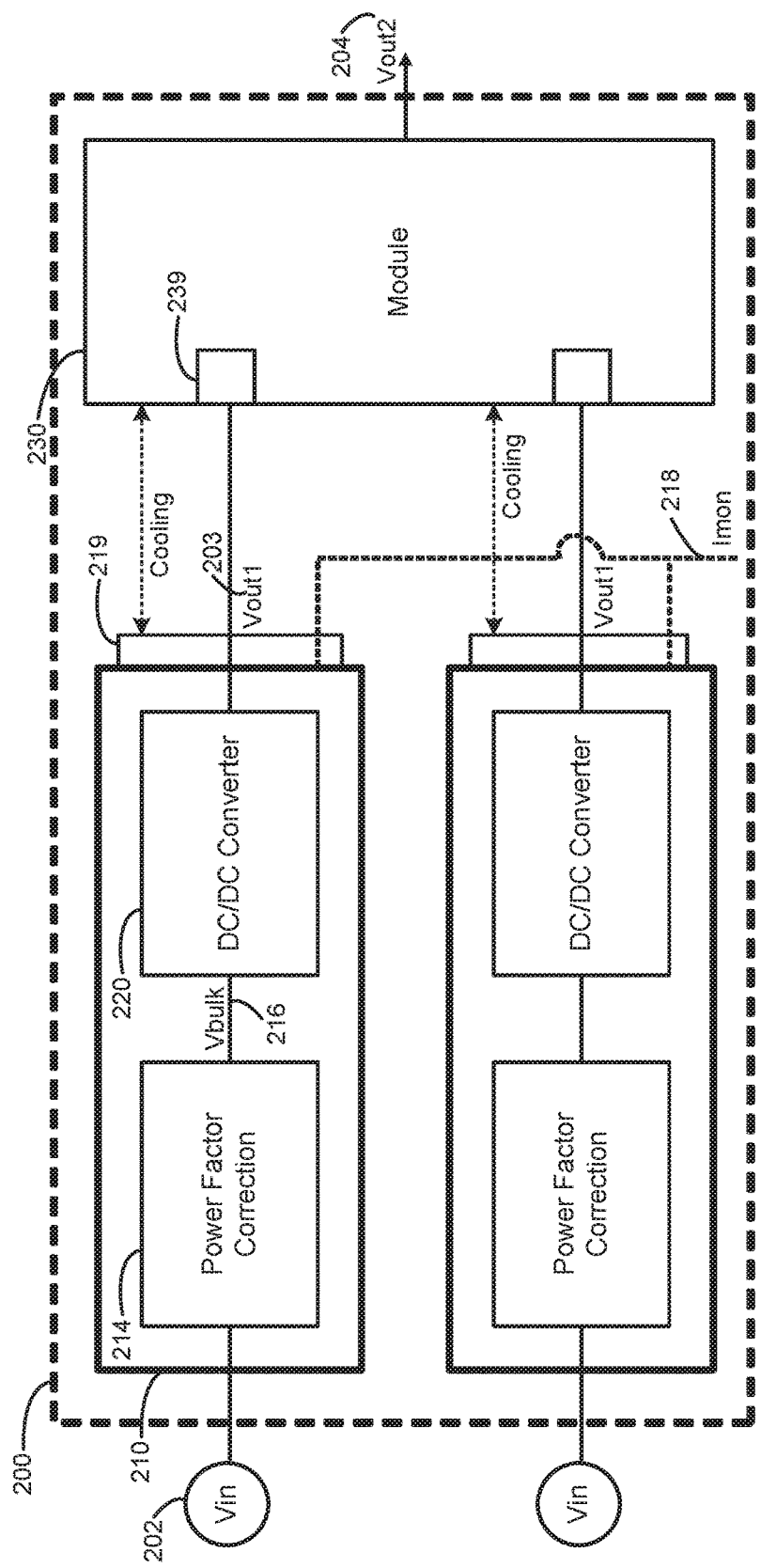
FIG. 2 is a block diagram of a power supply unit including a plurality of AC/DC converters and a module according to an example.

FIG. 2 is a block diagram of a power supply unit 200 including a plurality of AC/DC converters 210 and a module 230 according to an example. A given AC/DC converter 210 includes a power factor correction 214 to receive the input voltage Vin 202 and provide bulk voltage Vbulk 216. The AC/DC converter 210 also includes a DC/DC converter 220 to receive bulk voltage 216 and provide (via rear coupling 219) a first output voltage Vout1 203. The rear coupling 219 of the AC/DC converter 210 also can be used for cooling, and for the current monitoring signal Imon 218. A redundant arrangement is shown using two AC/DC converters 210 coupled to provide Vout1 (e.g., 48V) to the module 230 via front couplings 239. The module 230 can provide second output voltage Vout2 204 (e.g., 12V). Thus, the illustrated example module 230 is to convert the first output voltage Vout1 203 to a second output voltage Vout2 204. The example module 230 can provide the cooling via, e.g., fans (not shown in FIG. 2, see fans 338 of FIGS. 3B and 3C).

The modular nature of the PSU 200 enables at least one of the converters 210 and/or module 230 to be based on an isolated and/or non-isolated converter topology. Non-isolated and isolated topologies refer to whether an electrical barrier is provided between the input and output of the converters and/or modules. In an example implementation of the PSU 200, the DC/DC converters 220 are isolated, and the module 230 is non-isolated to provide DC/DC conversion between the first output voltage 203 and the second output voltage 204. Accordingly, example implementations can provide the benefit of flexibility in mixing isolated and non-isolated converter topologies within the same PSU 200.

Figure 5:
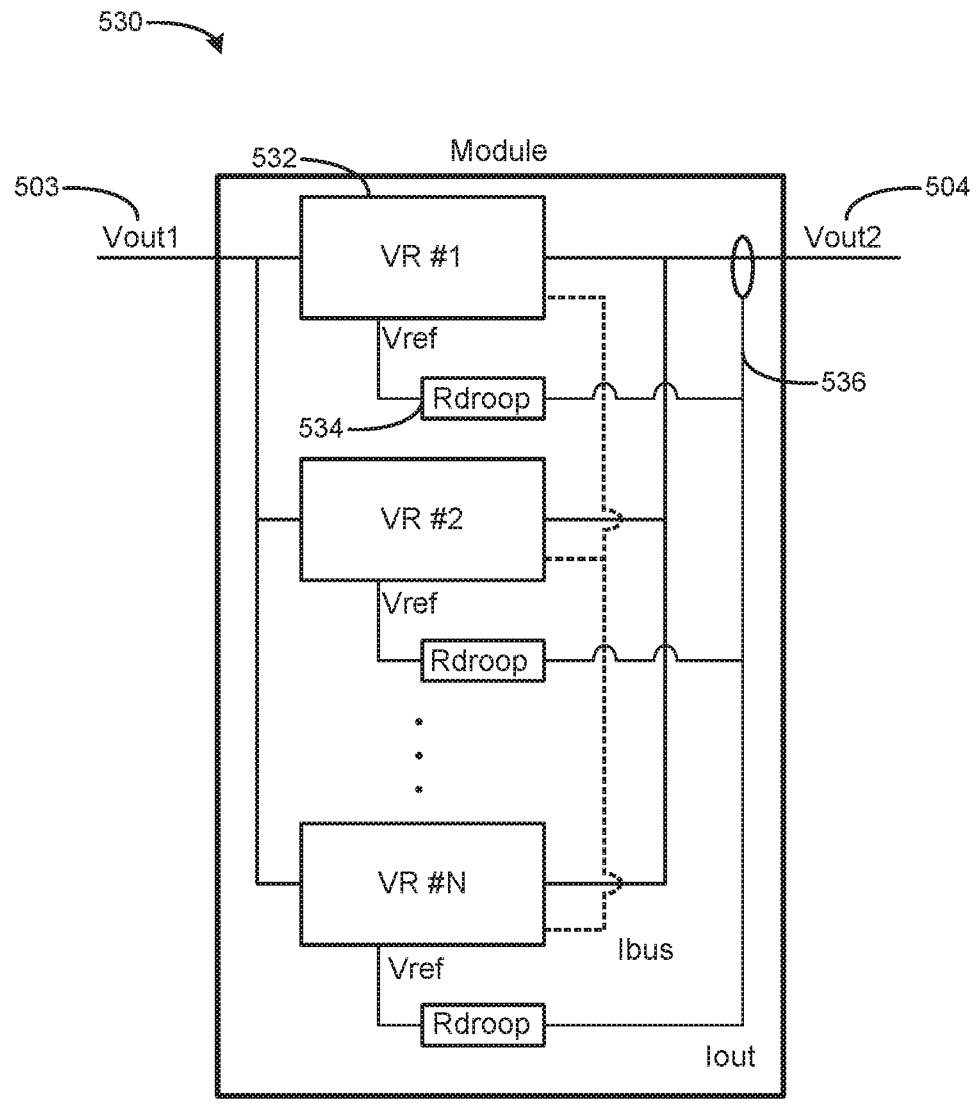
FIG. 5 is a circuit diagram of a module including at least one voltage regulator according to an example.

The PSU 200 can perform current balancing, e.g., between the multiple AC/DC converters 210. Current monitoring signal Imon 218 can be used to identify whether the AC/DC converters 210 are producing balanced output, and adjust the output of a given AC/DC converters 210 accordingly to bring it into balance. In alternate example implementations, the current monitoring signals Imon 218 (and, e.g., Ibus and/or Iout as shown in FIG. 5) can be omitted, and the PSU 200 can be operated without needing to specifically balance the AC/DC converters 210.

The module 230 is to provide cooling for the AC/DC converters 210, receive the first output voltage 203 (e.g., at front coupling 239) from the AC/DC converters 210, and convert the first output voltage 203 to the second output voltage 204 (and monitor signals from the AC/DC converters 210, such as Imon 218 and/or Vout1 203). Thus, the module 230 operates as a DC/DC converter to convert the first DC voltage 203 from the AC/DC converters 210 to a second DC voltage Vout2 204. The DC/DC module 230 can be designed based on a single voltage regulator (VR), or multiple VRs (e.g., see FIG. 5).

The module 230 can interface with the rear of the plurality of AC/DC converters 210, to provide cooling for the PSU 200 (i.e., cooling for the AC/DC converters 210 as well as the module 230 itself). For example, the module 230 can provide cooling to the PSU 200 based on directing airflow into the rear and out the front of the AC/DC converters 210. In alternative examples, the module 230 can provide cooling to the PSU 200 based on drawing airflow into the front and out the back of the AC/DC converters 210. The module 230 can include one, or multiple (e.g., two), fans mounted in the module 230 for cooling. In alternate examples, the module 230 can provide other types of cooling to the AC/DC converters 210, such as conductive plate-based or water-based cooling solutions.

As illustrated, the PSU 200 benefits from the architecture of arranging the AC/DC converters 210 toward the front of the PSU 200 to intake cool air, but without needing fans at the front of the AC/DC converters 210. Accordingly, additional frontal area is freed up on the AC/DC converters 210, to enable receiving the input voltage Vin 202 using a relatively larger size, higher-capacity input connector. The cooling and output voltage Vout2 204 are provided at the rear of the PSU 200.

Figure 3A:
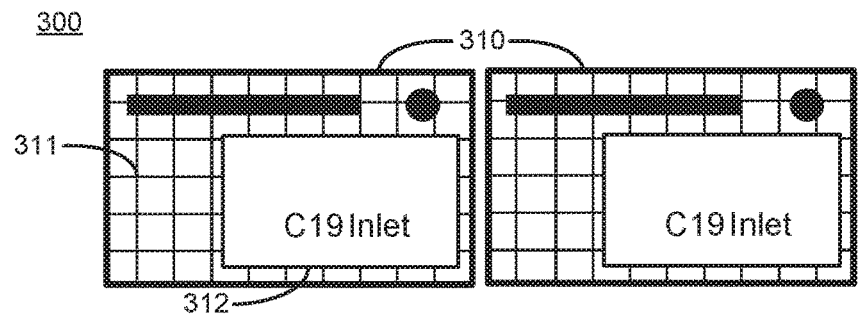
FIG. 3A is a front view block diagram of a power supply unit including a plurality of AC/DC converters including input connectors according to an example.
Figure 3B:
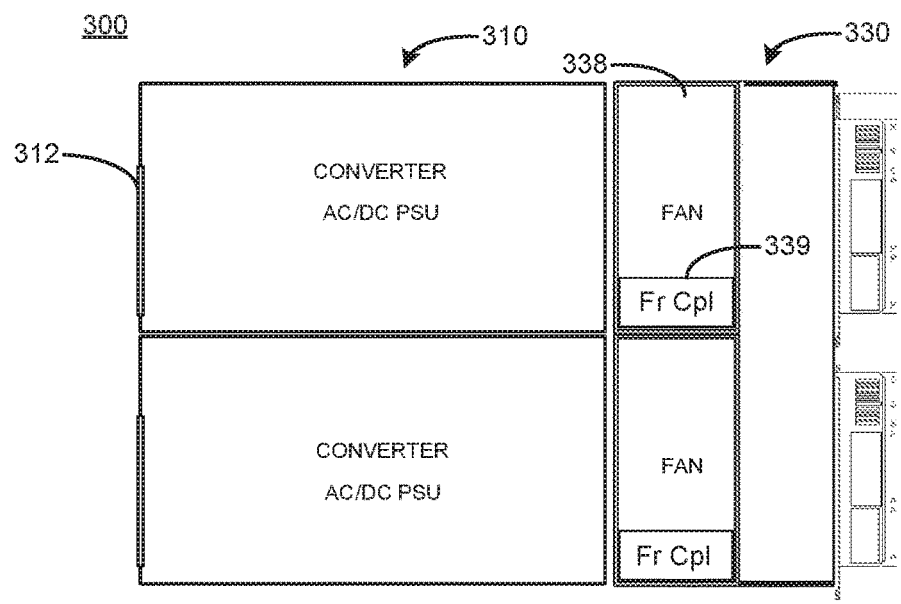
FIG. 3B is a top view block diagram of a power supply unit including a plurality of AC/DC converters and a module according to an example.

FIG. 3A is a front view block diagram of a power supply unit 300 including a plurality of AC/DC converters 310 including input connectors 312 according to an example. The illustrated example implementation is shown with IEC C19 AC inlet connectors as the input connectors 312, included within a grid structure 311 to release heat and/or admit air through the converters 310 (e.g., into the illustrated front of FIG. 3A, and out the rear toward the module 330 as shown in FIG. 3B), based on cooling provided by the module 330. Alternatively, the grid structure 311 can discharge output air provided by the module 330, in example implementations where the airflow is from rear to front of the converters 310. Accordingly, frontal area of the converters 310 can be devoted to accommodating the input connectors 312, without needing to accommodate a fan(s).

FIG. 3B is a top view block diagram of the power supply unit 300 including the plurality of AC/DC converters 310 and a module 330 according to an example. As illustrated, the fans 338 of the modular PSU 300 are located in the module 330, such that a given AC/DC converter 310 is fanless. As shown, the module 330 includes two fans 338, to provide cooling for the AC/DC converters 310. In alternate example implementations, one, or more than two, fans can be used, as well as other types of cooling solutions. The module 330 is coupled to each AC/DC converter 310 via front couplings 339. The illustrated PSU 300 demonstrates an example implementation of a 1+1 parallel design having 2× fanless AC/DC converters 310 providing first output voltage of 48 V, and 1× non-isolated DC/DC module 330 with 48 V input, 12 V output, and including 2×4028 type fans. In alternate example implementations, other voltage values (e.g., 24 V), as well as types of components, can be used.

Figure 3C:
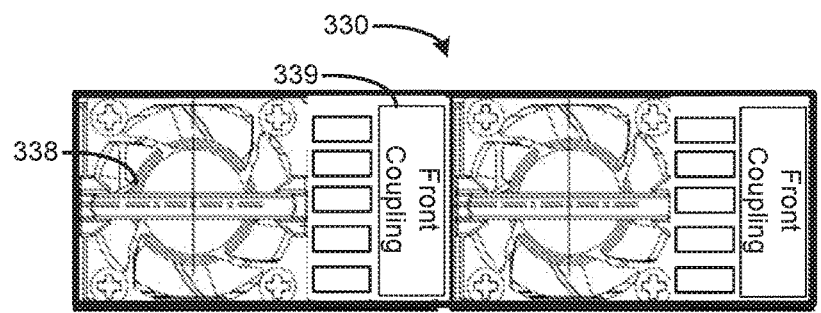
FIG. 3C is a front view block diagram of a module including a fan and front coupling according to an example.

FIG. 3C is a front view block diagram of a module 330 including a fan 339 and front coupling 339 according to an example. The module 330 includes the front coupling 339 at its front, to interface with the plurality of AC/DC converters 310. The front coupling 339 can pass power, cooling, signals, and the like between the module 330 and the AC/DC converters 310. Thus, cooling can be provided to the power supply unit 300 by the module 330, to cool the AC/DC converters 310, and the module 330. In alternate example implementations, the module 330 does not need to provide power conversion (e.g., does not need to convert the first output voltage from the AC/DC converters 310 into a second output voltage), and can serve as a fan module to provide cooling while passing the first output voltage from the AC/DC converters 310 through the front coupling 339 to a rear of the module 330. The front couplings 339 can serve as 2× input connectors, e.g., 48V-type input couplings including logic signal pins, to support one or multiple AC/DC converters 310 of the PSU 300. The fans 338 are illustrated as 2×4028 type fans, and other types of fans can be used.

Figure 4:
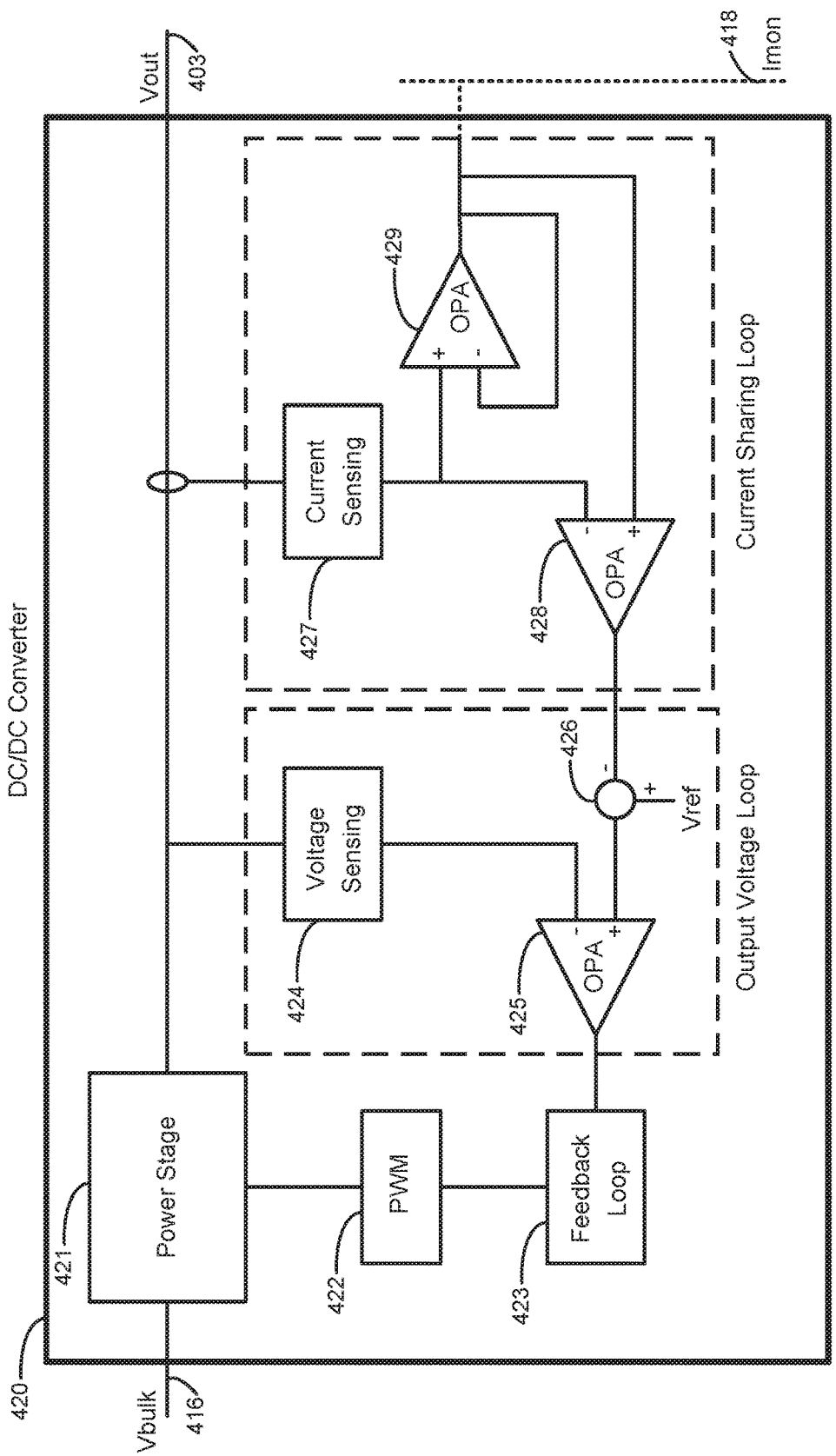
FIG. 4 is a circuit diagram of a DC/DC converter including a feedback loop according to an example.

FIG. 4 is a circuit diagram of a DC/DC converter 420 including a feedback loop 423 according to an example. In an example implementation, the DC/DC converter 420 can serve as the DC/DC converter of a given AC/DC converter, such as the DC/DC converter 220 illustrated in FIG. 2. In an example implementation, the DC/DC converter 420 can be based on an isolated topology to provide first output voltage Vout 403 of 48 V, although other implementations can use other output voltages (e.g., 12 V) and isolated or non-isolated topologies.

An example control technique is illustrated for the DC/DC converter 420. An input voltage, shown as Vbulk 416 (e.g., as received from a power factor correction 214 as illustrated in FIG. 2) is received by the power stage 421, which outputs the output voltage Vout 403. The output voltage 403 can be monitored by voltage sensing 424 and/or current sensing 427. The voltage sensing 424 can be compared, via first operational amplifier 425, to a reference voltage 426. The current sensing 427 can be used for current monitoring via Imon 418, and can be used by second Op Amp 428 as input for the reference voltage 426. Such results can be fed to the feedback loop 423, then to pulse width modulation 422, then to power stage 421. The feedback provided by the example output voltage loop and/or current sharing loop is an example implementation, and other techniques can be used (e.g., without needing to include active current sharing, such as by using a passive-based or droop-based methodology approach).

FIG. 5 is a circuit diagram of a module 530 including at least one voltage regulator 532 according to an example. The module 530 can serve as, e.g., the example module 230 of FIG. 2. As illustrated, more than one voltage regulator 532 is shown. However, in alternate example implementations, a module 530 can be based on a single voltage regulator 532. The at least one voltage regulator 432 is to convert the first DC output voltage 503 (received at the module 530 as input) to the second DC output voltage Vout2 504. In an example implementation, the module 530 can be based on a non-isolated topology to provide DC-to-DC conversion, with Vout1 being 48 V, and Vout2 being 12 V. In alternate implementations, other voltages and isolated or non-isolated topologies can be used.

The number of voltage regulators 532 can be chosen based on desired redundancy performance, depending on needs for uptime, reliability, while balancing heat and power dissipation factors. The illustrated example current balancing is based on a resistance droop (Rdroop) feedback technique, scaling back the output voltage Vout2 504 as a reference, used as a voltage point for comparison against a reference point to check for a difference to be amplified and corrected for by control circuitry. The Ibus signal can serve a similar purpose as the current monitoring Imon 218 described above regarding FIG. 2, coupled to the voltage regulators for current balancing. Ibus, and/or Iout, can be omitted in alternate example implementations, such that module 530 is operable without needing to include current balancing and/or feedback monitoring.

Figure 6:
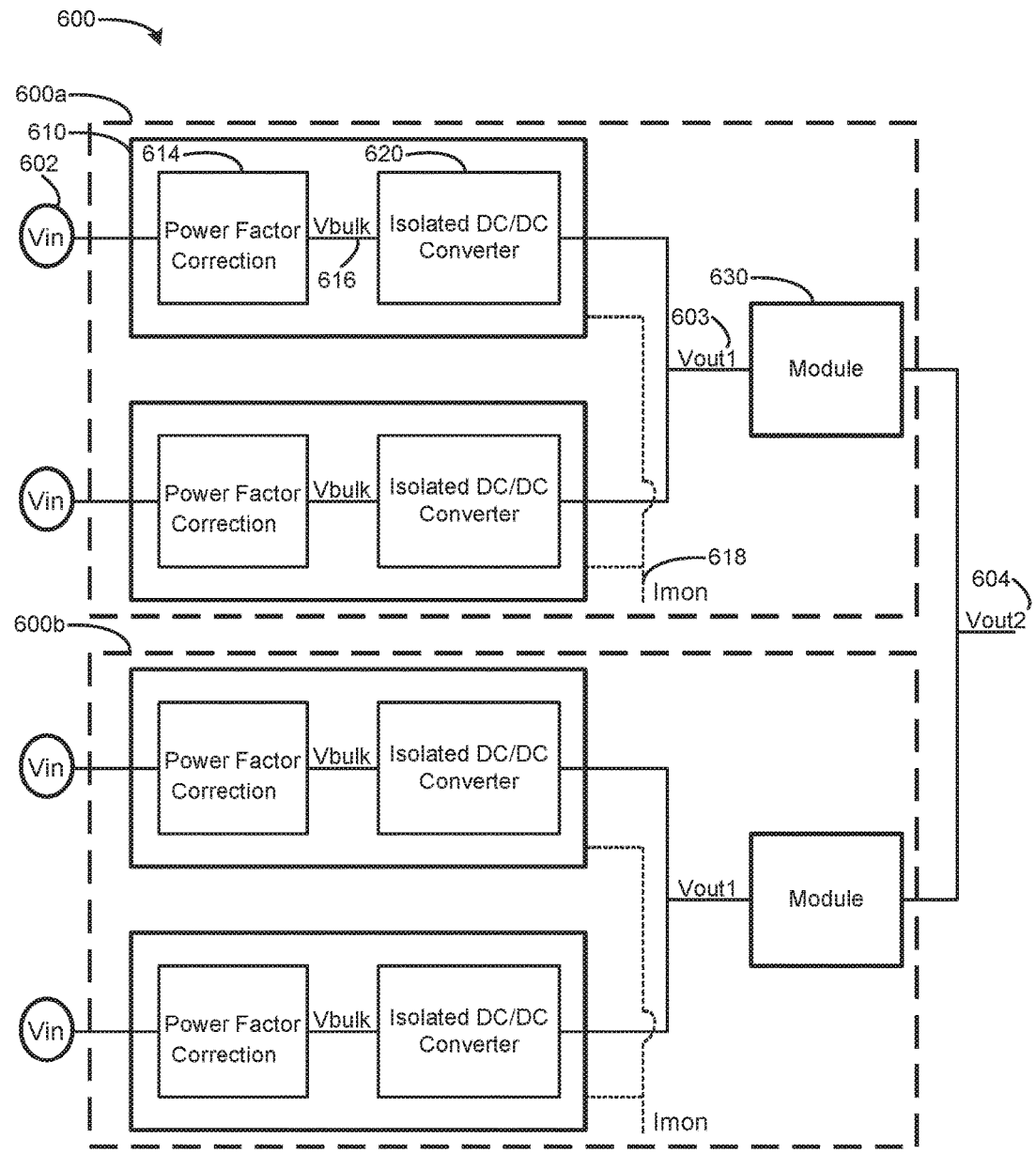
FIG. 6 is a block diagram of a plurality of redundantly coupled power supply units, including a plurality of AC/DC converters and modules according to an example.

FIG. 6 is a block diagram of a system 600 including a plurality of redundantly coupled power supply units 600a, 600b. A given one of the power supply units 600a, 600b includes a plurality of AC/DC converters 610, and at least one module 630 according to an example. In an example implementation, the AC/DC converters 610 are based on isolated DC/DC converters 620, to convert Vbulk 616 to Vout1 603 (Vbulk 616 obtained by the power factor correction 614 converting Vin 602). The module 630 is a non-isolated DC/DC converter, to convert Vout1 603 of 48 V to Vout2 604 of 12 V.

The system 600 illustrates an example 2+2 redundancy architecture deployment (e.g., which can be realized as a 4+0 or 3+1 redundancy). The system 600 uses a droop current sharing technique on a 12 V bus, although such buses (e.g., Imon or Ibus) are not specifically needed and can be omitted. The current monitoring Imon 618 is shown as being internally tied (e.g., within a given PSU 600a, 600b). In alternate embodiments, Imon (and/or other control signals), can be terminated external to the PSU and/or system, e.g., to be monitored externally, e.g., for readings of system power, system health, and other uses of the signals.

The upper PSU 600a provides at least two AC input voltage 602 inputs, with the lower PSU 600b providing additional redundancy and/or power outputs. Although the system 600 is shown having two PSUs 600a, 600b, the system 600 can be expanded by adding additional PSUs, and/or by including additional AC/DC converters 610 (and/or modules 630) in a given PSU, to provide additional power and/or redundancy.

The modular nature of the system 600 enables additional configurations and applications, such as using multiple modules 630 in parallel as shown, which in turn can be fed by multiple AC/DC converters 610. Accordingly, any of, or multiple of, the, isolated DC/DC converters 620 and/or power factor correction units 614 (for example) could fail, and redundancy would enable the system 600 to continue uninterrupted operations. The illustrated redundancy configuration can support, e.g., three types of redundancy configuration, such as 4+0, 3+1, or 2+2. Accordingly, upon failure of one of the AC/DC converters 610, the system can then continue operating as other configurations, such as 3+0 or 2+1. In alternate example embodiments, additional redundancy configurations and fallback configuration operations can be used.

What is claimed is:

1. A power supply unit comprising:
a plurality of fanless alternating current to direct current (AC/DC) converter modules coupled together to redundantly convert an input voltage to a first DC voltage, wherein an AC/DC converter module of the plurality of fanless AC/DC converter modules includes:
an input connector at a front face of the AC/DC converter module to receive the input voltage, wherein the input connector occupies greater than one third of a surface area of the front face of the AC/DC converter module;
an output coupling at a rear face, opposite the front face, of the AC/DC converter module to couple the AC/DC converter module to an input coupling at a front face of cooling module, and to output the first DC voltage through the cooling module;
the cooling module including the input coupling at the front face of the cooling module and an output coupling at a rear face of the cooling module to output the first DC voltage.

2. The power supply unit of claim 1, further comprising the front face of the cooling module that is to interface with the rear face of the AC/DC converter module of the plurality of fanless AC/DC converter modules to provide cooling to the power supply unit.

3. The power supply unit of claim 2, wherein the cooling module provides cooling to the power supply unit based on directing airflow into the rear face of the AC/DC converter module and out the front face of the AC/DC converter module of the plurality of fanless AC/DC converter modules.

4. The power supply unit of claim 2, wherein the cooling module provides cooling to the power supply unit based on drawing airflow into the front face of the AC/DC converter module and out the rear face of the AC/DC converter module of the plurality of fanless AC/DC converter modules.

5. The power supply unit of claim 2, wherein the cooling module operates as a DC/DC converter to convert the first DC voltage from the power supply unit to a second DC voltage.

6. The power supply unit of claim 1, wherein the input coupling at the front face of the cooling module includes a 48V-type coupling with logic signal pins to support the AC/DC converter module of the plurality of fanless AC/DC converter modules.

7. The power supply unit of claim 1, wherein the AC/DC converter module of the plurality of fanless AC/DC converter modules provide isolated power conversion.

8. The power supply unit of claim 1, wherein the cooling module is to provide non-isolated power conversion.

9. A system comprising:
a plurality of fanless alternating current to direct current (AC/DC) converter modules coupled together to redundantly convert an input voltage to an output voltage, wherein an AC/DC converter module of the plurality of fanless AC/DC converter modules includes:
an input connector to receive the input voltage at a front face of the AC/DC converter module, wherein the input connector occupies greater than one third of a surface area of the front face of the AC/DC converter module; and an output coupling at a rear face, opposite the front face, of the AC/DC converter module to couple the AC/DC converter module to a cooling module via an input coupling at a front face of the cooling module, and to output the output voltage through the cooling module; and the cooling module coupled to an input coupling of each of the plurality of fanless AC/DC converter modules to convert the output voltage, received at the front face of the cooling module, from a first DC output voltage to a second DC output voltage, wherein the cooling module includes an output coupling at a rear face of the cooling module to output the second DC voltage to a computing system.

10. The system of claim 9, wherein at least one of i) the plurality of fanless AC/DC converter modules and ii) the cooling module is based on an isolated converter topology.

11. The system of claim 9, wherein at least one of i) the plurality of fanless AC/DC converter modules and ii) the cooling module is based on a non-isolated converter topology.

12. The system of claim 9, wherein the cooling module includes at least one fan to provide cooling for the AC/DC converter module of the plurality of fanless AC/DC converter modules.

13. The system of claim 9, wherein the cooling module includes at least one voltage regulator to convert the first DC output voltage to the second DC output voltage.

14. An alternating current to direct current (AC/DC) converter module, comprising:

an input connector at a front face of the AC/DC converter module to receive an input voltage, wherein the input connector occupies greater than one third of a surface area of the front face of the AC/DC converter module, and wherein the AC/DC converter module is to convert the input voltage to a DC voltage;

an output coupling at a rear face, opposite the front face, of the AC/DC converter module to couple the AC/DC converter module to a cooling module via an input coupling at a front face of the cooling module to receive cooling to cool the AC/DC converter module from the cooling module, wherein the output coupling of the AC/DC converter module at the rear face of the AC/DC converter module outputs the DC voltage to the input coupling at the front face of the cooling module, through the cooling module, and out an output coupling of the cooling module at a rear face of the cooling module;

wherein the AC/DC converter module is fanless.

15. The system of claim 14, wherein the AC/DC converter module includes a grid structure to admit air through the AC/DC converter module based on cooling provided by the cooling module coupled to the AC/DC converter module.

* * * * *